United States Patent [19]

Vossen, Jr. et al.

[11] 4,395,467

[45] Jul. 26, 1983

[54] TRANSPARENT CONDUCTIVE FILM HAVING AREAS OF HIGH AND LOW RESISTIVITY

[75] Inventors: John L. Vossen, Jr., Bridgewater, N.J.; Joseph Zelez, Tannersville, Pa.

[73] Assignee: RCA Corporation, New York, N.Y.

[21] Appl. No.: 335,707

[22] Filed: Dec. 30, 1981

[51] Int. Cl.³ .......................... C23C 15/00; B05D 3/06
[52] U.S. Cl. ................................. 428/697; 204/192 N; 427/38; 428/702
[58] Field of Search ..................... 427/35, 38, 108–110; 204/192 N; 428/697, 702

[56] References Cited

U.S. PATENT DOCUMENTS

| | | | |
|---|---|---|---|
| 4,177,093 | 12/1979 | Feng et al. | 427/35 X |
| 4,198,246 | 4/1980 | Wu | 148/1.5 |
| 4,229,502 | 10/1980 | Wu et al. | 428/446 |
| 4,336,277 | 6/1982 | Bunshah et al. | 427/38 X |

*Primary Examiner*—Michael R. Lusignan
*Attorney, Agent, or Firm*—Birgit E. Morris; R. Hain Swope

[57] ABSTRACT

A method of forming areas of high and low resistivity in a transparent film of indium oxide and zirconium oxide is disclosed. The film is selectively ion implanted with protons and then annealed to lower the resistivity in the non-implanted portion.

8 Claims, No Drawings

TRANSPARENT CONDUCTIVE FILM HAVING AREAS OF HIGH AND LOW RESISTIVITY

This invention relates to transparent conductive films having areas of high and low resistivity and the use thereof in electronic devices.

BACKGROUND OF THE INVENTION

Transparent, conductive films have a wide variety of uses and have in recent years become increasingly important in the electronics industry. Such films are required for numerous devices such as television camera vidicons and liquid crystal displays.

One of the problems inherent in films prepared from semiconductor oxides such as stannous oxide, indium oxide, cadmium oxide and the like is that they have absorption edges in the near UV or in the blue end of the visible spectrum. This is disadvantageous in that most electronic devices have poor blue response and the absorption characteristics of such films aggravate the situation.

In our copending patent application, U.S. Ser. No. 335,708, filed Dec. 30, 1981, there is disclosed novel transparent conductive films of indium oxide and zirconium oxide having high conductivity and high optical transmission throughout the visible spectrum, particularly at the blue end. There is, however, a need to have such films contain areas of high and low resistivity to make them particularly useful in the production of certain electronic components such as charge coupled imaging devices (CCD imaging devices).

SUMMARY OF THE INVENTION

In accordance with this invention there is provided a method of creating areas of high and low resistivity in transparent conductive films of indium oxide and zirconium oxide.

DETAILED DESCRIPTION OF THE INVENTION

Transparent films of indium oxide and zirconium oxide are provided in accordance with our copending patent application U.S. Ser. No. 335,708, filed concurrently herewith and incorporated herein by reference. These films are preferably prepared by rf sputtering a suitable target comprised of from about 40 to about 60 percent by weight of each oxide.

The subject films are ideally suited for the preparation of charge transfer imagers such as charge injection device (CID) imagers and charge coupled device (CCD) imagers which are front-surface illuminated. Such imagers are utilized, for example, in the photoelectric image detector of solid-state television cameras.

Present CCD imaging devices for camera chips are back-surface illuminated. This requires that the silicon wafers which are the substrate for the CCD imaging devices be ultra thin, i.e. about 10 micrometers thick, to minimize absorption of light by the silicon. This process renders the chip fragile and detracts from the efficiency thereof. There has been, therefore, an effort to develop front-illuminated CCD imaging devices which would do away with wafer thinning and produce considerable savings in cost, yield and device efficiency.

The semi-insulating areas in a top layer of a structure such as a CCD imaging device should have a sheet resistivity of between $10^8$ and $10^{11}$ ohms/sq. whereas the conductive areas should have a sheet resistivity of about 20 ohms/sq or less. The semi-insulating areas function as charge leaks between conductive channels. Such areas are formed in conventional polysilicon interconnect material for such devices by depositing a film of high resistivity and treating it in some way to create areas of low resistivity. Usually, the film if implanted with an electrically active impurity, such as phosphorus, boron or arsenic, to create the areas of low resistivity.

In order to reduce resistivity, we attempted to ion implant protons into the subject films with the object of creating ion vacancies. This approach was considered unique since ion implantation, to our knowledge, had not previously been reported as a means of altering the properties of transparent conductive films. Unexpectedly, however, ion implantation did not have the desired effect on either the as-deposited film or the film after it had been annealed.

As described in our copending application U.S. Ser. No. 335,708 annealing of the as-deposited transparent films of indium oxide and zirconium oxide produces a precipitous drop in resistivity when the temperature exceeds about 700° C. We have found that ion implantation of the as-deposited film with protons effectively blocks the decrease in resistivity otherwise caused by annealing. This is just the opposite of what would be expected from proton ion implantation. This effect could certainly not have been predicted from what is known about films containing only indium oxide, for example, since implantation with protons decreases the resistance thereof. The mechanism by which the effect produced in accordance with this invention occurs is unknown.

Therefore, in accordance with this invention, a transparent film of indium oxide and zirconium oxide having selected areas of high and low resistivity is formed by ion implantation of the as-deposited film with protrons followed by annealing of the film at a temperature in excess of 700° C.

As previously stated, the subject films are preferably prepared by rf sputtering onto a suitable substrate. The sputtering target is a mixture of indium oxide and zirconium oxide in the same weight ratios as the films. The films can be of varying thickness depending on the intended use thereof. Generally, the subject films should be between about 2,500 and 5,000 angstroms, preferably about 3,500 angstroms thick. The rf sputtering gas is a mixture of oxygen and argon, preferably in a partial pressure ratio of from about 50:50 to about 70:30. The pressure in the sputtering chamber is not particularly critical, and is generally between about 10 and 30 millitorr.

Ion implantation of the subject transparent conductive films is carried out in conventional ion implantation equipment. Generally, a dose of between about $10^{10}$ and $10^{16}$ protrons/cm$^2$, preferably about $10^{16}$ protons/cm$^2$ is utilized. Implantation is carried out conventionally by using a mask of resist material and flood exposing the target. Typically, implant energy is from about 10 to about 300 KeV, preferably about 30 KeV.

After implantation, the film is annealed in accordance with our copending application, U.S. Ser. No. 335,708 i.e. the film is annealed in a reducing gas atmosphere at a temperature between about 700° and 850° C., preferably at about 750° C. The preferred reducing gas is hydrogen, usually in combination with an inert gas such as nitrogen, argon and the like. A preferred reducing gas is forming gas which is a mixture of hydrogen and nitrogen. Forming gas conventionally is hydrogen and nitrogen in a 1:9 partial pressure ratio.

Annealing of the subject films in a reducing gas dramatically reduces resistivity in the areas not ion-implanted from an initial sheet resistivity above about $10^{11}$ ohms/sq. to a sheet resistivity of about 20 ohms/sq or less. The resistivity of the ion-implanted areas of the film is unaffected by annealing as described hereinabove. Thus, the present invention provides a convenient, effective means of producing transparent conductive films having areas of high and low conductivity.

The subject films are useful in a wide variety of applications, particularly charge transfer imagers such as CCD imagers. As is conventional with films of this type, the subject films are formed directly on the substrate and then treated to create areas of high and low resistivity The following Example further illustrates this invention, it being understood that the invention is in no way intended to be limited to the details described therein. In the Example all parts and percentages are on a weight basis and all temperatures are in degrees Celsius, unless otherwise stated.

EXAMPLE 1

A target consisting of an equal weight percent mixture of indium oxide and zirconium oxide was placed in a conventional rf sputtering apparatus. Utilizing p- or n-type silicon wafers coated with a 2500 angstroms thick coating of silicon dioxide as a substrate, a transparent film 3,500 angstroms thick was formed thereover.

The film was covered with a layer of the positive photoresist Hunt 204 available from Hunt Chemical Co. which was irradiated and developed. The photoresist layer served as an ion-implant mask. The film was ion-implanted with protons in the areas not covered by the protecting layer of resist utilizing a dose of $10^{16}$ protons/cm$^2$ and an implant energy of 30 KeV. The resist masking layer was removed by dissolving in a suitable solvent and the film annealed in forming gas, i.e. a mixture of nitrogen and hydrogen in a partial pressure ratio of 9:1, for 15 minutes at 750°.

The sheet resistivity of the ion-implanted areas was $10^{11}$ ohms/sq., which was the sheet resistivity of the film as deposited. In contrast, the sheet resistivity of the non-implanted areas had been reduced to 20 ohms/sq. The electrical and optical properties of the film remained constant upon exposure to normal variables of temperature and humidity.

We claim:

1. A method of producing areas of high and low resistivity in a transparent film of indium oxide and zirconium oxide comprising ion implanting protrons into a portion of said film and annealing the film in a reducing gas at a temperature above about 700° C. thereby substantially lowering the resistivity of that portion of the film not ion implanted.

2. A method in accordance with claim 1, wherein the film is implanted with a dose of from about $10^{10}$ to about $10^{16}$ protons/cm$^2$.

3. A method in accordance with claim 1, wherein the film is annealed at a temperature from about 700° C. and about 850° C.

4. A method in accordance with claim 1, wherein the film is annealed at a temperature of about 750° C.

5. A method in accordance with claim 1, where the film is annealed in a reducing gas atmosphere of hydrogen and an inert gas.

6. A method in accordance with claim 5, wherein said atmosphere is hydrogen and nitrogen in a partial pressure ratio of 1:9.

7. A method of forming a transparent conductive layer having areas of high and low resistivity on a substrate comprising depositing a film of indium oxide and zirconium oxide on said substrate, ion implanting protons into a portion of said film and annealing the film in reducing gas at a temperature above about 700° C. thereby substantially lowering the resistivity of that portion of the film not ion implanted.

8. A structure produced in accordance with the method of claim 7.

* * * * *